US012811058B2

(12) United States Patent
Stormont et al.

(10) Patent No.: US 12,811,058 B2
(45) Date of Patent: Nov. 24, 2026

(54) OVERMOLDED RESONATORS FOR A RADIO FREQUENCY COIL

(71) Applicant: GE Precision Healthcare LLC, Waukesha, WI (US)

(72) Inventors: Robert Steven Stormont, Hartland, WI (US); David Michael Berendt, Aurora, OH (US)

(73) Assignee: GE Precision Healthcare LLC, Waukesha, WI (US)

( * ) Notice: Subject to any disclaimer, the term of this patent is extended or adjusted under 35 U.S.C. 154(b) by 175 days.

(21) Appl. No.: 18/802,070

(22) Filed: Aug. 13, 2024

(65) Prior Publication Data

US 2026/0051438 A1 Feb. 19, 2026

(51) Int. Cl.
*H01F 41/12* (2006.01)
*G01R 33/34* (2006.01)

(52) U.S. Cl.
CPC ............. *H01F 41/12* (2013.01); *G01R 33/34* (2013.01)

(58) Field of Classification Search
CPC ........... H01F 41/12; H01F 5/00; G01R 33/34; G01R 33/34007; G01R 33/34084; G01R 33/341; G01R 33/3415; G01R 33/3628; G01R 33/48; A61B 5/055
See application file for complete search history.

(56) References Cited

U.S. PATENT DOCUMENTS

2019/0310329 A1 10/2019 Malik et al.
2020/0271738 A1 * 8/2020 Qin .................. G01R 33/34084

* cited by examiner

*Primary Examiner* — G.M. A Hyder
(74) *Attorney, Agent, or Firm* — Fletcher Yoder, P.C.

(57) ABSTRACT

A method for manufacturing overmolded resonators for a radio frequency receiving coil assembly for a magnetic resonance imaging system includes providing a pair of conductive wires, wherein each conductive wire of the pair of conductive wires has a set required length. The method also includes holding the pair of conductive wires in a fixed spatial arrangement relative to each other. The method further includes overmolding dielectric material over the pair of conductive wires to form an overmolded conductive wire assembly. The method even further includes coupling the pair of conductive wires to an electronics unit.

19 Claims, 13 Drawing Sheets

OVERMOLDED RESONATORS FOR A RADIO FREQUENCY COIL

BACKGROUND

The subject matter disclosed herein relates to medical imaging and, more particularly, to overmolded resonators of a radio frequency (RF) receiving coil of a magnetic resonance imaging (MRI) system.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field B1) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

The MRI system utilizes an RF coil receiving coil. The RF receiving coil includes resonators that need to be manufactured to specific criteria. The manufacturing of these resonators poses a challenge.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a method for manufacturing overmolded resonators for a radio frequency receiving coil assembly for a magnetic resonance imaging system is provided. The method includes providing a pair of conductive wires, wherein each conductive wire of the pair of conductive wires has a set required length. The method also includes holding the pair of conductive wires in a fixed spatial arrangement relative to each other. The method further includes overmolding dielectric material over the pair of conductive wires to form an overmolded conductive wire assembly. The method even further includes coupling the pair of conductive wires to an electronics unit.

In another embodiment, a method for manufacturing overmolded resonators for a radio frequency receiving coil assembly for a magnetic resonance imaging system is provided. The method includes placing each conductive wire of a pair of conductive wires into a respective receptacle of a former, wherein each conductive wire of the pair of conductive wires has a set required length, and the former holds the pair of conductive wires in a parallel arrangement at a fixed distance from each other. The method also includes overmolding dielectric material over the pair of conductive wires and the former to form an overmolded conductive wire assembly. The method further includes coupling the pair of conductive wires to an electronics unit.

In a further embodiment, a radio frequency (RF) receiving coil assembly for a magnetic resonance imaging system is provided. The RF receiving coil assembly includes an RF coil. The RF coil includes a plurality of loops. Each loop includes an overmolded conductive wire assembly having a plurality of overmolded resonators. Each overmolded conductive wire assembly includes a pair of conductive wires with each wire disposed in a respective receptacle of a former, each conductive wire of the pair of conductive wires has a set required length, the former holds the pair of conductive wires in a parallel arrangement at a fixed distance from each other, and dielectric material is overmolded over the pair of conductive wires and the former.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
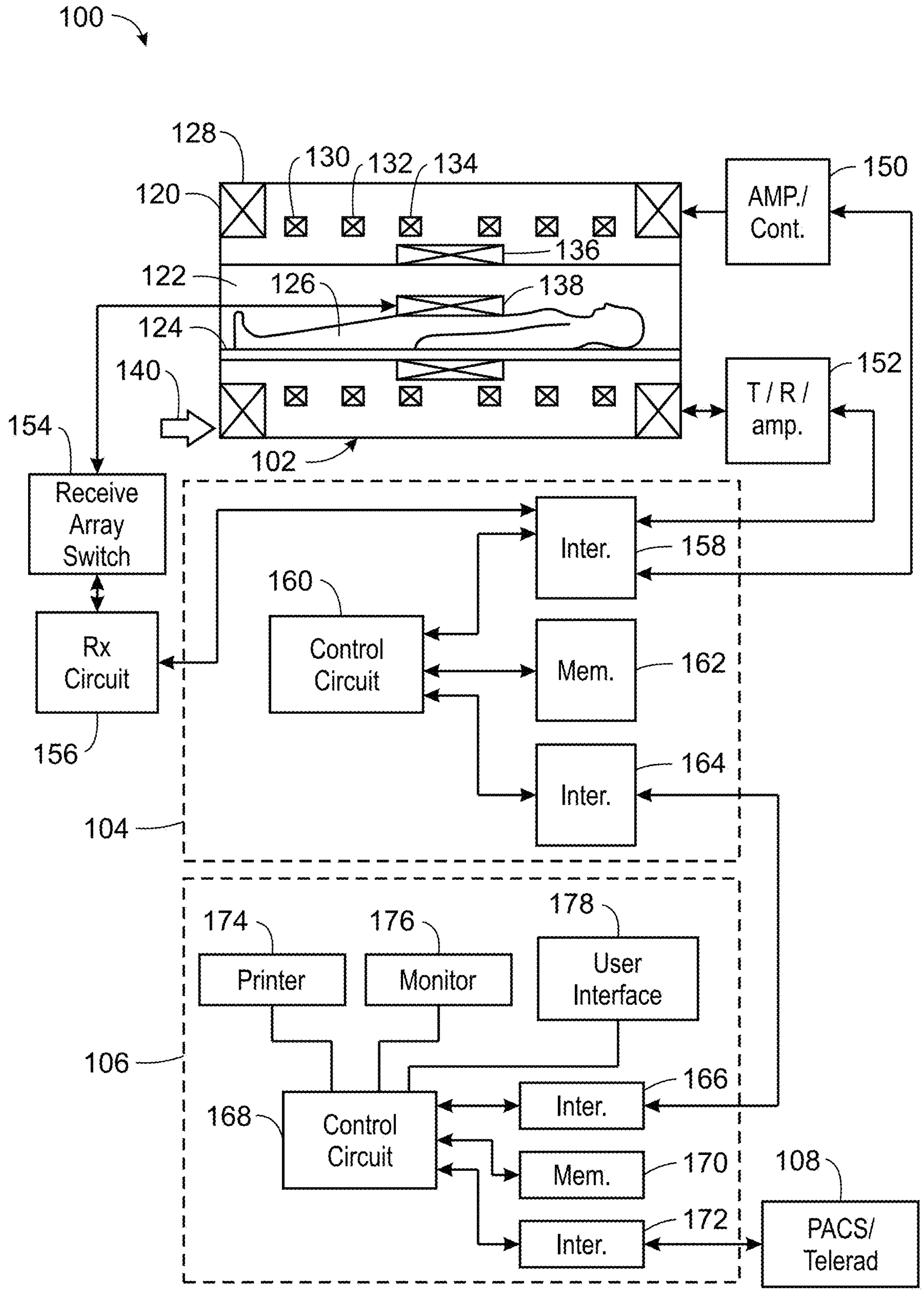
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

Manufacturing resonators (e.g., within loops or channels) for an RF coil is a difficult process. The disclosed embodiments provide techniques for manufacturing overmolded resonators for an RF coil. In an embodiment, a method for manufacturing overmolded resonators for a radio frequency receiving coil assembly for a magnetic resonance imaging system includes providing a pair of conductive wires, wherein each conductive wire of the pair of conductive wires has a set required length. The method also includes holding the pair of conductive wires in a fixed spatial arrangement relative to each other. The method further includes overmolding dielectric material (e.g., insulator) over the pair of conductive wires to form an overmolded conductive wire assembly. The method even further includes coupling the pair of conductive wires to an electronics unit.

In certain embodiments, the method further includes placing each conductive wire of the pair of conductive wires into a respective receptacle of a former, wherein former holds the pair of conductive wires in a parallel arrangement at a fixed distance from each other. In certain embodiments, the method further includes overmolding the dielectric material over the pair of conductive wires and the former. In certain embodiments, the former is made of a material that is chemically inert and flexible. In certain embodiments, the method further includes, prior to overmolding with the dielectric material, twisting the former holding the pair of conductive wires. In certain embodiments, respective outer edges of each receptacle of the former include features to grip a respective conductive wire of the pair of conductive wires. In certain embodiments, the overmolded resonators have a distributed capacitance. In certain embodiments, the method further includes, prior to overmolding with the dielectric material, cutting at least one conductive wire of the pair of conductive wires while being held. In certain embodiments, overmolding includes overmolding additional features on an overmolding disposed over the pair of conductive wires. In certain embodiments, the additional features include respective strain reliefs located at respective ends of the overmolded conductive wire assembly, wherein the respective strain reliefs are configured to snap into a feedboard (e.g., printed circuit board) of the electronics unit.

In an embodiment, a method for manufacturing overmolded resonators for a radio frequency receiving coil assembly for a magnetic resonance imaging system includes placing each conductive wire of a pair of conductive wires into a respective receptacle of a former, wherein each conductive wire of the pair of conductive wires has a set required length, and the former holds the pair of conductive wires in a parallel arrangement at a fixed distance from each other. The method also includes overmolding dielectric material (e.g., insulator) over the pair of conductive wires and the former to form an overmolded conductive wire assembly. The method further includes coupling the pair of conductive wires to an electronics unit.

In certain embodiments, the former is made of a material that is chemically inert and flexible. In certain embodiments, the method further includes, prior to overmolding with the dielectric material, twisting the former holding the pair of conductive wires. In certain embodiments, respective outer edges of each receptacle of the former include features to grip a respective conductive wire of the pair of conductive wires. In certain embodiments, the overmolded resonators have a distributed capacitance. In certain embodiments, the method further includes, prior to overmolding with the dielectric material, cutting at least one conductive wire of the pair of conductive wires while being held by the former. In certain embodiments, overmolding includes overmolding additional features on an overmolding disposed over the pair of conductive wires. In certain embodiments, the additional features include respective strain reliefs located at respective ends of the overmolded conductive wire assembly, wherein the respective strain reliefs are configured to snap into a feedboard of the electronics unit.

In an embodiment, a radio frequency (RF) receiving coil assembly for a magnetic resonance imaging system is provided. The RF receiving coil assembly includes an RF coil. The RF coil includes a plurality of loops. Each loop includes an overmolded conductive wire assembly having a plurality of overmolded resonators. Each overmolded conductive wire assembly includes a pair of conductive wires with each wire disposed in a respective receptacle of a former, each conductive wire of the pair of conductive wires has a set required length, the former holds the pair of conductive wires in a parallel arrangement at a fixed distance from each other, and dielectric material is overmolded over the pair of conductive wires and the former. In certain embodiments, each overmolded conductive wire assembly includes respective strain reliefs overmolded at respective ends of the overmolded conductive wire assembly, wherein the respective strain reliefs are configured to snap into a feedboard of an electronics unit.

The disclosed embodiments enables creating an assembly (e.g., overmolded conductive wire assembly) at a required length and features with a dielectric material overmold. The disclosed embodiments provide a more static approach or process to set wires more precisely in the dielectric material (i.e., to control wire spacing). The disclosed embodiments enable advanced features (e.g., strain reliefs) to be overmolded on that provide a robust and simple interface with a feedboard of an electronics unit. The disclosed embodiments enable including a slow linear twist (e.g., of 90 or 180 degrees approximately every 5 centimeters (cm)) in the assembly for better flexing on both axes. The disclosed embodiments provide a more reliable approach for manufacturing resonators (and loops) for an RF coil.

With the preceding in mind, FIG. 1 a magnetic resonance imaging (MRI) system 100 is illustrated schematically as including a scanner 102, scanner control circuitry 104, and system control circuitry 106. According to the embodiments described herein, the magnetic resonance imaging system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the magnetic resonance imaging system 100 may include any suitable scanner or detector, in the illustrated embodiment, the system 100 includes a full body scanner 102 having a housing 120 through which a bore 122 is formed. A table 124 is moveable into the bore 122 to permit a patient 126 to be positioned therein for imaging selected anatomy within the patient.

Scanner 102 includes a series of associated coils for producing controlled magnetic fields for exciting the gyromagnetic material within the anatomy of the subject being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain gyromagnetic nuclei within the patient 126 during examination sequences. A radio frequency (RF) coil 136 (e.g., radio frequency transmit coil) is configured to generate radio frequency pulses for exciting the certain gyromagnetic nuclei within the patient. In addition to the coils that may be local to the scanner 102, the system 100 also includes a set of receiving coils or radio frequency receiving coils 138 (e.g., an array of coils) configured for placement proximal (e.g., against) to the patient 126. As an example, the receiving coils 138 can include body coils such as cervical/thoracic/lumbar (CTL) coils, head coils, single-sided spine coils, and so forth. Generally, the receiving coils 138 are placed close to or on top of the patient 126 so as to receive the weak radio frequency signals (weak relative to the transmitted pulses generated by the scanner coils) that are generated by certain gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, $B_0$. A power input (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuitry 104.

Another control circuit 152 is provided for regulating operation of the radio frequency coil 136. Circuit 152 includes a switching device for alternating between the active and inactive modes of operation, wherein the radio frequency coil 136 transmits and does not transmit signals, respectively. Circuit 152 also includes amplification circuitry configured to generate the radio frequency pulses. Similarly, the receiving coils 138 are connected to switch 154, which is capable of switching the receiving coils 138 between receiving and non-receiving modes. Thus, the receiving coils 138 resonate with the radio frequency signals produced by relaxing gyromagnetic nuclei from within the patient 126 while in the receiving mode, and they do not resonate with radio frequency energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuitry 104 includes an interface circuit 158, which outputs signals for driving the gradient field coils and the radio frequency coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuitry 104 and system control circuitry 106. In certain embodiments, the control and analysis circuit 160, while illustrated as a single unit, may include one or more hardware devices. The system control circuit 106 includes an interface circuit 166, which receives data from the scanner control circuitry 104 and transmits data and commands back to the scanner control circuitry 104. The control and analysis circuit 168 may include a CPU in a multi-purpose or application specific computer or workstation. Control and analysis circuit 168 is coupled to a memory circuit 170 to store programming code for operation of the magnetic resonance imaging system 100 and to store the processed image data for later reconstruction, display and transmission. The programming code may execute one or more algorithms that, when executed by a processor, are configured to perform reconstruction of acquired data.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
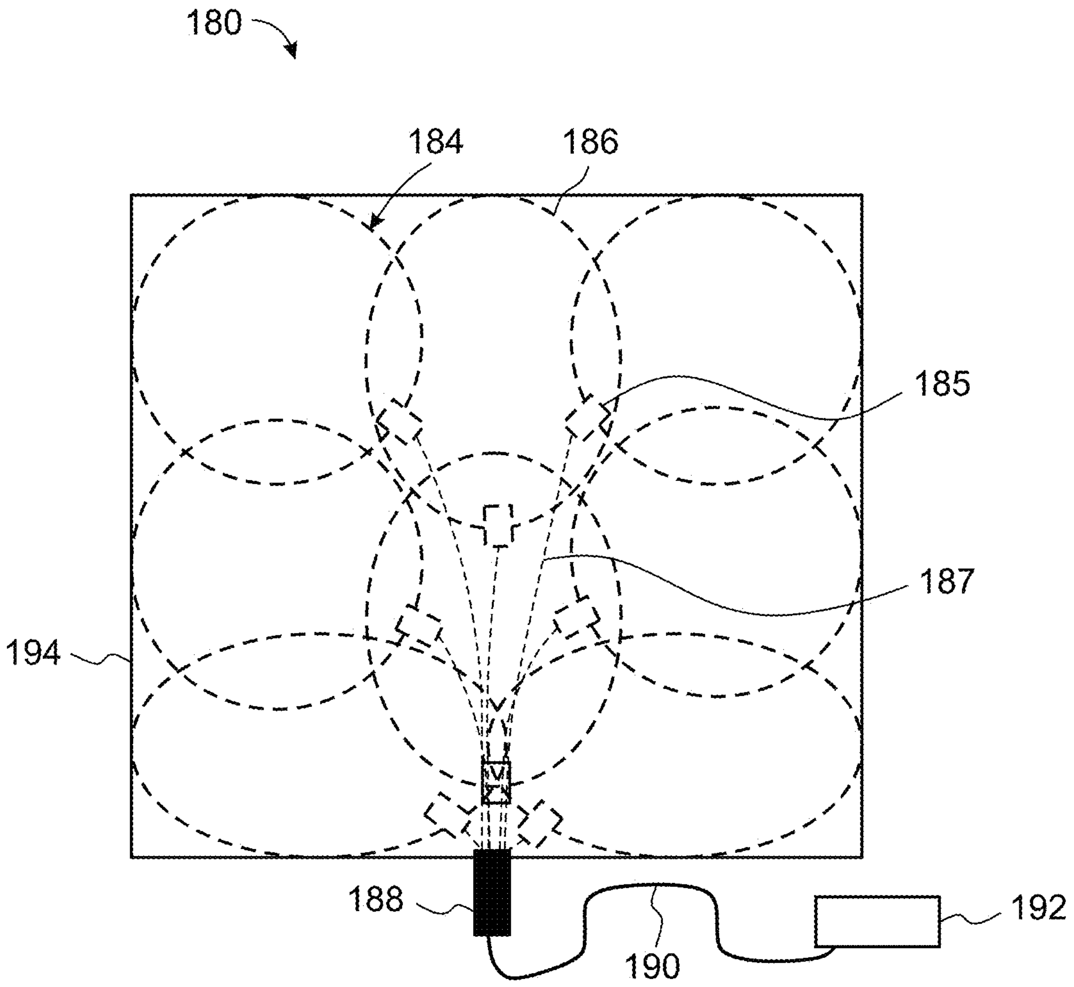
FIG. 2 is a schematic diagram of an RF coil array and its topology, in accordance with aspects of the present disclosure.

FIG. 2 is a schematic diagram of a radio frequency coil assembly 180 (e.g., radio frequency receiving coil assembly) having coil elements (overmolded resonators or loops). The radio frequency coil assembly 180 may be utilized in an magnetic resonance imaging system (e.g., magnetic resonance imaging system 100 in FIG. 1). The radio frequency coil assembly 180 includes an radio frequency coil 184 having a plurality of coil elements 186 (e.g., loops or channels or overmolded resonators). Each element 186 is coupled to an electronics unit 185 coupled to a coil-interfacing cable 187. The coil-interfacing cables 187 of each of the coil elements 186 is coupled to an electrical connector interface or interface circuitry 188 (e.g., a balun such as integrated balun cable harness which may act as an radio frequency trap). The electrical connector interface 188 is coupled (via a cable 190) to a P connector 192 (e.g., port connector) that enables the radio frequency coil assembly 180 to be coupled (e.g., via wired connection) to the interface of the magnetic resonance imaging system that couples imaging components to processing components. In certain embodiments, the radio frequency coil assembly 180 may lack a wired connection and may be configured to be utilized wirelessly (e.g., for coupling imaging components to wireless components) with the magnetic resonance imaging system during an magnetic resonance imaging scan.

Each element (or loop) 186 may consist of linked overmolded resonator coil elements coupled to a printed circuit board module (e.g., the electronics unit 185). Each element 186 (and associated resonator coil elements) includes a distributed capacitance construction. The resonators with distributed capacitance enable asymmetric drive of a transmission line like structure. Each electronics unit 185 may include various components (e.g., a decoupling circuit, an impedance inverter circuit, and a pre-amplifier). The radio frequency coil 184 may be designed utilizing AIR™ coil technology from General Electric Healthcare. This enables the radio frequency coil 184 to be lightweight and flexible. In certain embodiments, each element 186 may stretch (e.g., due to a zig-zag or meandering structure). In addition, the coil elements 186 of the radio frequency coil 184 are transparent, thus, aiding signal-to-noise ratios.

The radio frequency coil 184 is disposed within a flexible enclosure 194 (e.g., blanket). As depicted, the flexible enclosure 194 has a rectangular shape. In certain embodiments, the flexible enclosure 194 may have a square shape or other shape. In certain embodiments, the flexible enclosure 194 includes holes or openings to increase a flexibility of the radio frequency coil assembly 180 (and the flexible enclosure 194). Each hole or opening may be radially located within the element 186. In certain embodiments, the flexible enclosure 194 may include deformable material within. The deformable material may include foam, memory foam, expanded foam, polyurethane foam, gels such as hydrogel, cells of water, or other suitable deformable material. When the subject lies on the radio frequency coil assembly 180, the subject will sink into the deformable material and the radio frequency coil 184 may conform to the subject's unique shape and, thus, be right up against the patient's body. As depicted, the interface circuitry 188 is disposed within the flexible enclosure 194. In certain embodiments, the interface circuitry 188 may be disposed outside the flexible enclosure 194.

As discussed above, each flexible coil element 186 may be constructed utilizing conductive wires (e.g., silver plated copper wires). In certain embodiments, each conductive wire may be a bundle having a plurality conductive fibers.

Figure 3:
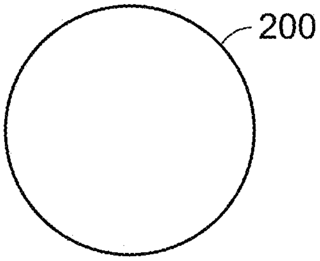
FIG. 3 is a cross-section of an RF coil, in accordance with aspects of the present disclosure.

FIG. 3 is a schematic diagram of a cross-section of a conductive fiber 200 that may be utilized to form coil elements. The entirety of the conductive fiber 200 is conductive. In certain embodiments, the conductive fiber may be copper (e.g., silver plated copper). As depicted, the conductive fiber 200 is bare. No cover (dielectric material or shielding layer) is disposed about the conductive fiber 200 itself.

Figure 4:
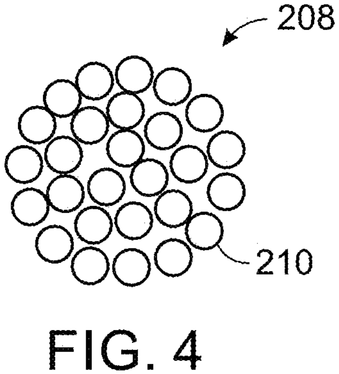
FIG. 4 is schematic diagram of another topology of an RF coil within an RF coil array (e.g., of a bundle), in accordance with aspects of the present disclosure.

FIG. 4 is a schematic diagram of a cross-section of a bundle 208 (e.g., bare bundle) of conductive fibers 210 (e.g., conductive fiber 200 in FIG. 3) that may be utilized to form coil elements. The bundle 208 includes a plurality of conductive fibers 210. The number of conductive fibers 210 in the bundle 208 may vary. No cover (e.g., dielectric material or shielding layer) is disposed about the bundle 208 itself.

Figure 5:
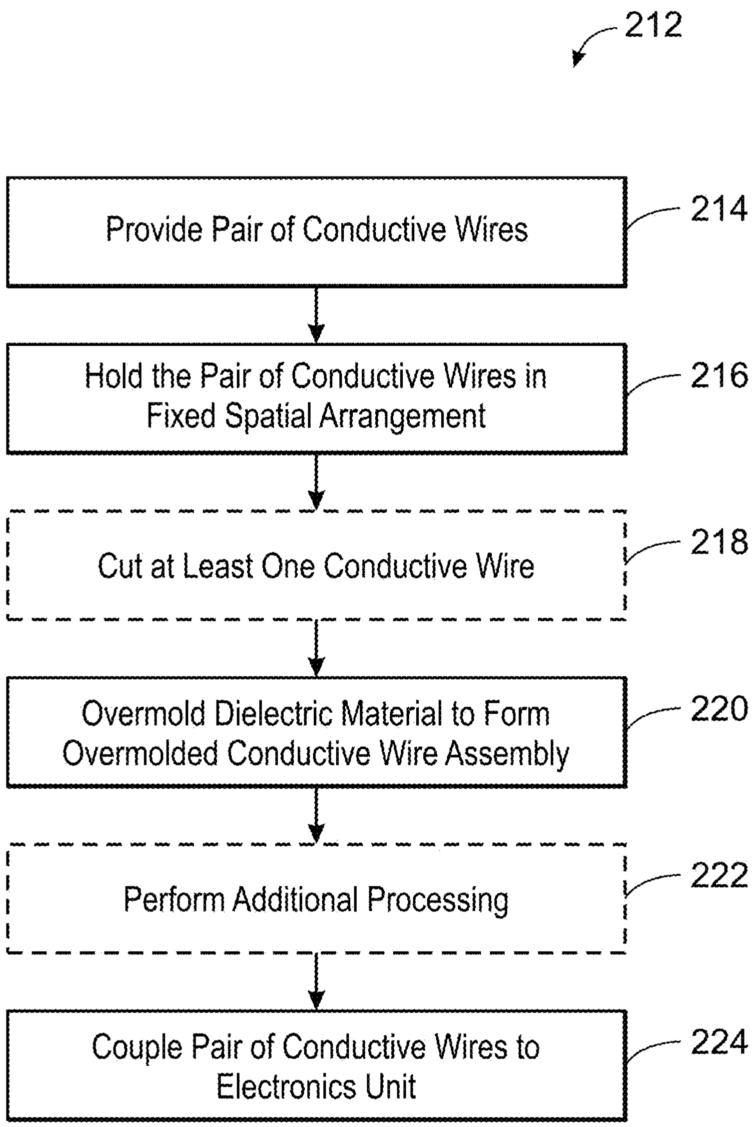
FIG. 5 is a flow chart of a method for manufacturing overmolded resonators for a radio frequency receiving coil assembly for a magnetic resonance imaging system, in accordance with aspects of the present disclosure.

FIG. 5 is a flow chart of a method 212 for manufacturing overmolded resonators for a radio frequency receiving coil assembly for a magnetic resonance imaging system. The method 212 includes providing a pair of conductive wires, wherein each conductive wire of the pair of conductive wires has a set required (e.g., desired) length (block 214). In certain embodiments, each conductive wire may be made of copper (e.g., silver plated copper). In certain embodiments, each conductive wire may be bundle of conductive fibers. In certain embodiments, the pair of conductive wires may have different length. In certain embodiments, the pair of conductive wires may have a same length.

The method 212 also includes holding the pair of conductive wires in a fixed spatial arrangement relative to each other (block 216). In certain embodiments, a former (e.g., made via microextrusion) may be utilized to hold the pair of conductive wires in a parallel arrangement at a fixed distance from each other. The fixed distance may vary based on the desired characteristics for the coil element. In certain embodiments, the former may be made of material that is highly flexible, impervious to most corrosives, inert, heat resistant (e.g., up to 260 degrees Celsius), and having high dielectric strength. In certain embodiments, the former is made of fluoroethylenepropylene (FEP) or polytetrafluoroethylene (PTFE). In certain embodiments, a clamping mechanism may be utilized to hold pair of conductive wires in the fixed spatial arrangement. In certain embodiments, one or both ends of a respective conductive wire may be axially offset from one or both ends of the other conductive wire of the pair of conductive wires.

In certain embodiments, the method 212 includes (prior to overmolding) cutting at least one conductive wire of the pair of conductive wires while being held (block 218). In certain embodiments, only one conductive wire is cut (or notched) one or more times. In certain embodiments, each conductive wire is cut (or notched) one or more times. The spatial arrangement of the cuts or notches relative to each other on the same conductive wire and/or on the other conductive wire may vary based on the desired characteristics for the coil element.

The method 212 further includes overmolding dielectric material over the pair of conductive wires (e.g., forming an overmolded conductive wire assembly) (block 220). The dielectric material may be may be rubber, plastic, or some other dielectric material (e.g., FEP or PTFE). In embodiments, where one or more of the pair conductive wires include notches or cuts (e.g., forming wire segments), the dielectric material fills in the respective spaces created by the cut or notch. The overmolded wires and/or spaced wire segments form the overmolded resonators. In certain embodiments, the overmolding includes overmolding additional features on an overmolding disposed over the pair of conductive wires. In certain embodiments, the overmolding of additional features may be separate overmolding performed after block 220. In certain embodiments, the additional features may include respective strain reliefs located at respective ends of the overmolded conductive wire assembly, wherein the respective strain reliefs are configured to snap into a feedboard of the electronics unit. The additional features may include other shapes disposed at one or more locations along a length of the overmolded conductive wire assembly.

In certain embodiments, the method 212 even further includes performing additional processing of the overmolded conductive wire assembly (block 222). In certain embodiments, the additional processing includes heat shrinking. In certain embodiments, the additional processing includes trimming a length of bare ends of the conductive wires extending from the overmolded conductive wire assembly. The method 212 even further includes coupling the pair of conductive wires to an electronics unit (block 224).

Figure 6:
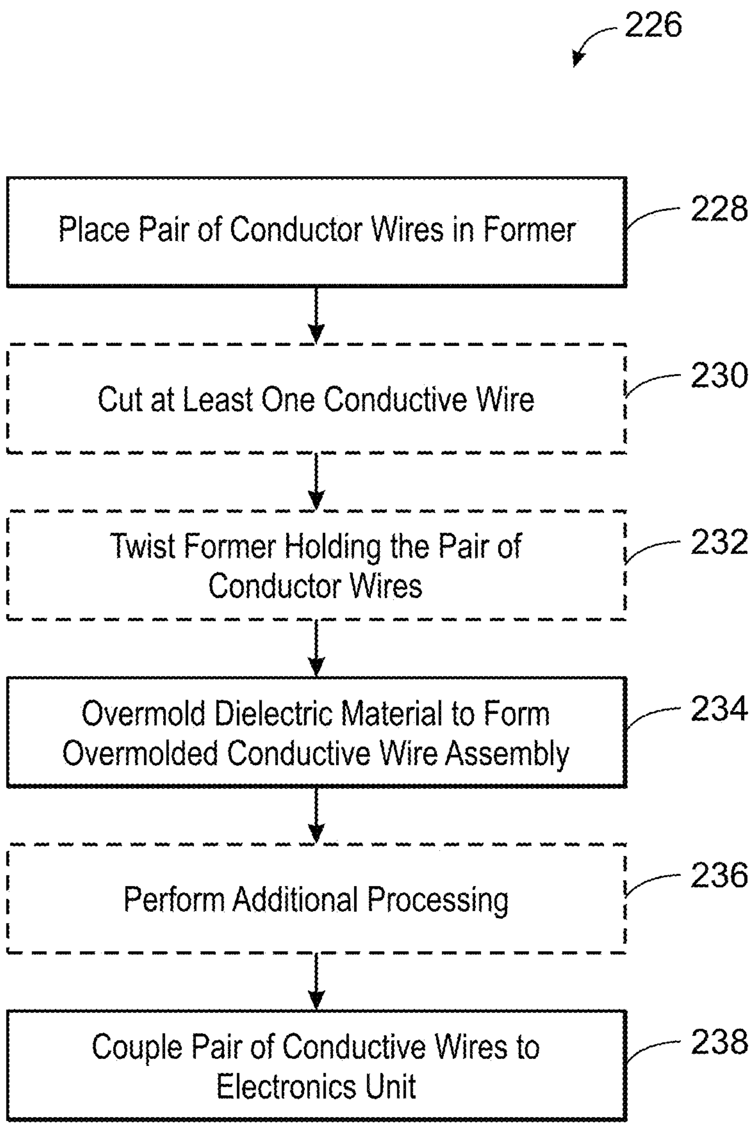
FIG. 6 is a flow chart of a method for manufacturing overmolded resonators for a radio frequency receiving coil assembly for a magnetic resonance imaging system (e.g., using a former), in accordance with aspects of the present disclosure.

FIG. 6 is a flow chart of a method 226 for manufacturing overmolded resonators for a radio frequency receiving coil assembly for a magnetic resonance imaging system (e.g., using a former). The method 226 includes placing each conductive wire of a pair of conductive wires into a respective receptacle of a former (block 228). Each conductive wire of the pair of conductive wires has a set required length. The former holds the pair of conductive wires in a parallel arrangement at a fixed distance from each other. The fixed distance may vary based on the desired characteristics for the coil element. In certain embodiments, each conductive wire may be made of copper (e.g., silver plated copper). In certain embodiments, each conductive wire may be bundle of conductive fibers. In certain embodiments, the pair of conductive wires may have different length. In certain embodiments, the pair of conductive wires may have a same length. In certain embodiments, the former is made via microextrusion. In certain embodiments, the former may be made of material that is highly flexible, impervious to most corrosives, inert, heat resistant (e.g., up to 260 degrees Celsius), and having high dielectric strength. In certain embodiments, the former is made of FEP or PTFE. In certain embodiments, one or both ends of a respective conductive wire may be axially offset from one or both ends of the other conductive wire of the pair of conductive wires.

In certain embodiments, the method 226 includes (prior to overmolding) cutting at least one conductive wire of the pair of conductive wires while being held (block 230). In certain embodiments, only one conductive wire is cut (or notched) one or more times. In certain embodiments, each conductive wire is cut (or notched) one or more times. The spatial arrangement of the cuts or notches relative to each other on the same conductive wire and/or on the other conductive wire may vary based on the desired characteristics for the coil element.

The method 226 further includes twisting the former holding the pair of conductive wires (block 232). In certain embodiments, a slow linear twist (e.g., of 90 or 180 degrees approximately every 5 centimeters (cm)) is applied for better flexing on both axes.

The method 226 even further includes overmolding dielectric material over the pair of conductive wires (e.g., forming an overmolded conductive wire assembly) (block 234). The dielectric material may be may be rubber, plastic, or some other dielectric material (e.g., FEP or PTFE). In embodiments, where one or more of the pair conductive wires include notches or cuts (e.g., forming wire segments), the dielectric material fills in the respective spaces created by the cut or notch. The overmolded wires and/or spaced wire segments form the overmolded resonators. In certain embodiments, the overmolding includes overmolding additional features on an overmolding disposed over the pair of conductive wires. In certain embodiments, the overmolding of additional features may be separate overmolding performed after block 234. In certain embodiments, the additional features may include respective strain reliefs located at respective ends of the overmolded conductive wire assembly, wherein the respective strain reliefs are configured to snap into a feedboard of the electronics unit. The additional features may include other shapes disposed at one or more locations along a length of the overmolded conductive wire assembly.

In certain embodiments, the method 226 even further includes performing additional processing of the overmolded conductive wire assembly (block 236). In certain embodiments, the additional processing includes heat shrinking. In certain embodiments, the additional processing includes trimming a length of bare ends of the conductive wires extending from the overmolded conductive wire assembly. The method 226 even further includes coupling the pair of conductive wires to an electronics unit (block 238).

Figure 7:
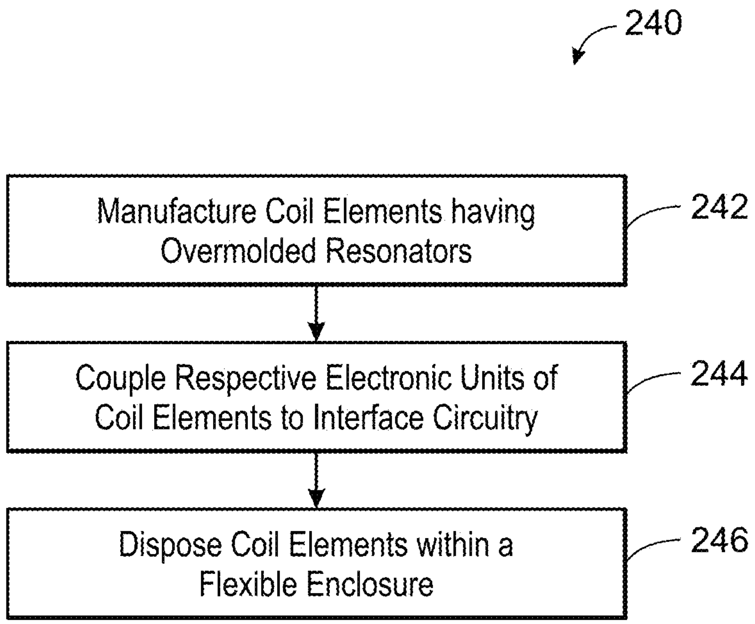
FIG. 7 is a flow chart of a method for manufacturing an RF receiving coil assembly having overmolded resonators, in accordance with aspects of the present disclosure.

FIG. 7 is a flow chart of a method 240 for manufacturing an RF receiving coil assembly having overmolded resonators. The method 240 includes manufacturing coil elements or loop having overmolded resonators as described in the method 212 in FIG. 5 or the method 226 in FIG. 6 (block 242). The method 240 also includes coupling the respective electronics units of the coil elements to an electrical connector interface or interface circuitry 188 (e.g., a balun such as integrated balun cable harness which may act as an radio frequency trap) via respective coil-interfacing cable (block 244). The method 240 further includes disposing the coil elements within a flexible enclosure (block 246).

Figure 8:
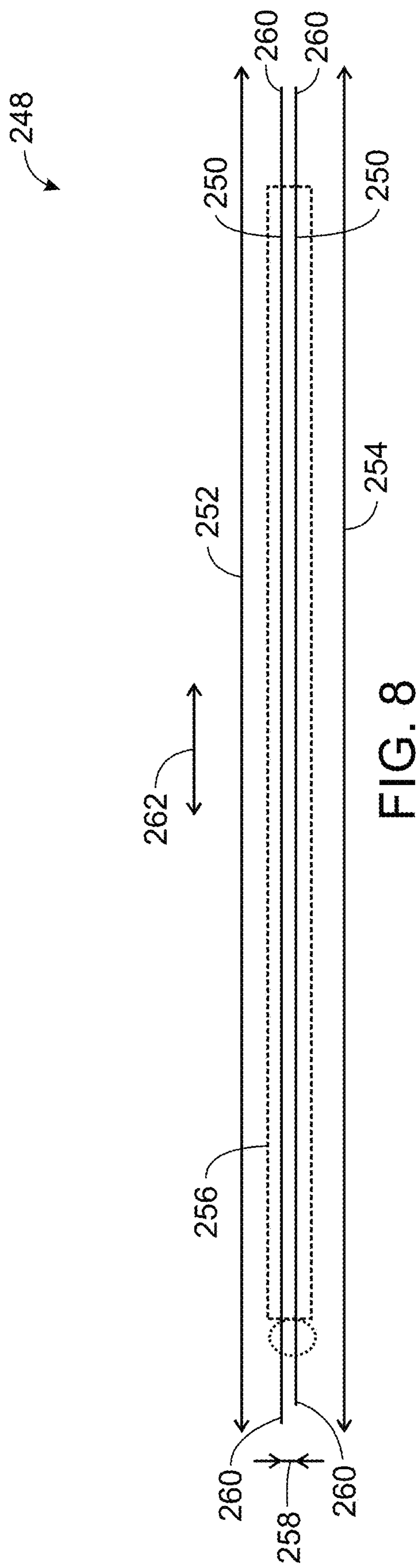
FIG. 8 is a schematic diagram of an overmolded conductive wire assembly, in accordance with aspects of the present disclosure.

FIG. 8 is a schematic diagram of an overmolded conductive wire assembly 248. The overmolded conductive wire assembly 248 is manufactured utilizing either the method 212 in FIG. 5 or the method 226 in FIG. 6. The overmolded conductive wire assembly 248 includes a pair of conductive wires 250. Each conductive wire 250 of the pair of conductive wires 250 has a respective set required (e.g., desired) length 252, 254. In certain embodiments, each conductive wire 250 may be made of copper (e.g., silver plated copper). In certain embodiments, each conductive wire may 250 be bundle of conductive fibers. As depicted, the pair of conductive wires 250 may have different length 252, 254. In certain embodiments, the pair of conductive wires 250 may have a same length 252, 254. The pair of conductive wires 250 are overmolded with a dielectric material 256 (e.g., insulator). The dielectric material 256 may be may be rubber, plastic, or some other dielectric material (e.g., FEP or PTFE). The pair of conductive wires 250 are disposed in a fixed spatial arrangement relative to each other at a fixed distance 258 from each other. In certain embodiments, a former (e.g., made via microextrusion) may be utilized to hold the pair of conductive wires 250 in a parallel arrangement at the fixed distance 258 from each other. The fixed distance 258 may vary based on the desired characteristics for the coil element. The former may also be overmolded with the dielectric material 256. As depicted, one or both ends 260 of a respective conductive wire 250 may be axially offset (in axial direction 262) from one or both ends 260 of the other conductive wire 250 of the pair of conductive wires 250. As depicted, the ends 260 of the conductive wires 250 extend beyond the overmolded dielectric material 256 of the overmolded conductive wire assembly 248.

Figure 9:
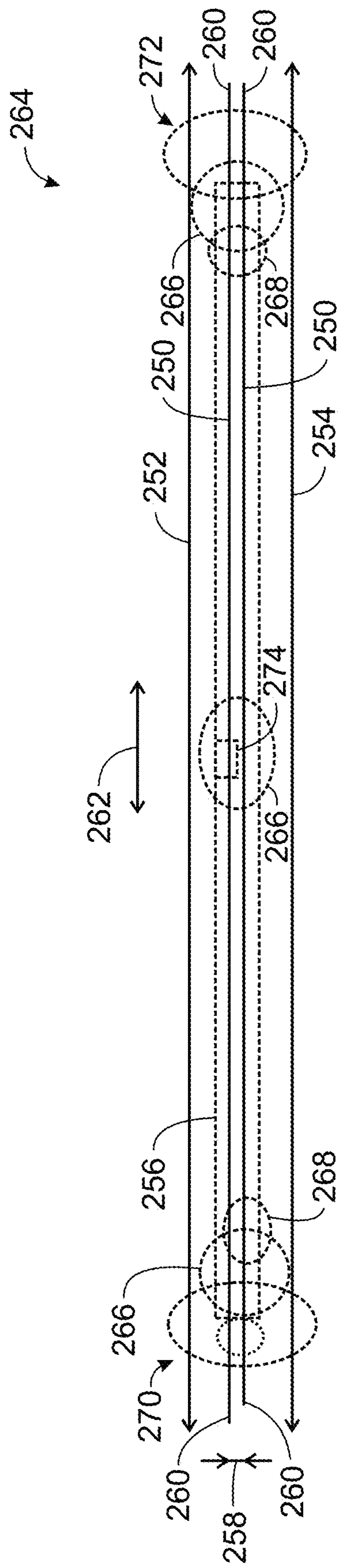
FIG. 9 is a schematic diagram of an overmolded conductive wire assembly, in accordance with aspects of the present disclosure (e.g., having additional features overmolded), in accordance with aspects of the present disclosure.

FIG. 9 is a schematic diagram of an overmolded conductive wire assembly 264 (e.g., having additional features overmolded). The overmolded conductive wire assembly 264 is manufactured utilizing either the method 212 in FIG. 5 or the method 226 in FIG. 6. The overmolded conductive wire assembly 264 is as described in FIG. 8. In addition, the overmolded conductive wire assembly 264 includes additional features 266 overmolded on it. For example, the overmolded conductive wire assembly 264 includes respective strain reliefs 268 located at respective ends 270, 272 of the overmolded conductive wire assembly 264, wherein the respective strain reliefs 268 are configured to snap into a feedboard of the electronics unit (e.g., electronics unit 185 in FIG. 2). The additional features 266 may include other shapes disposed at one or more locations along a length of the overmolded conductive wire assembly 264. As depicted, an additional feature 274 is centrally located on the overmolded conductive wire assembly 264.

Figure 10:
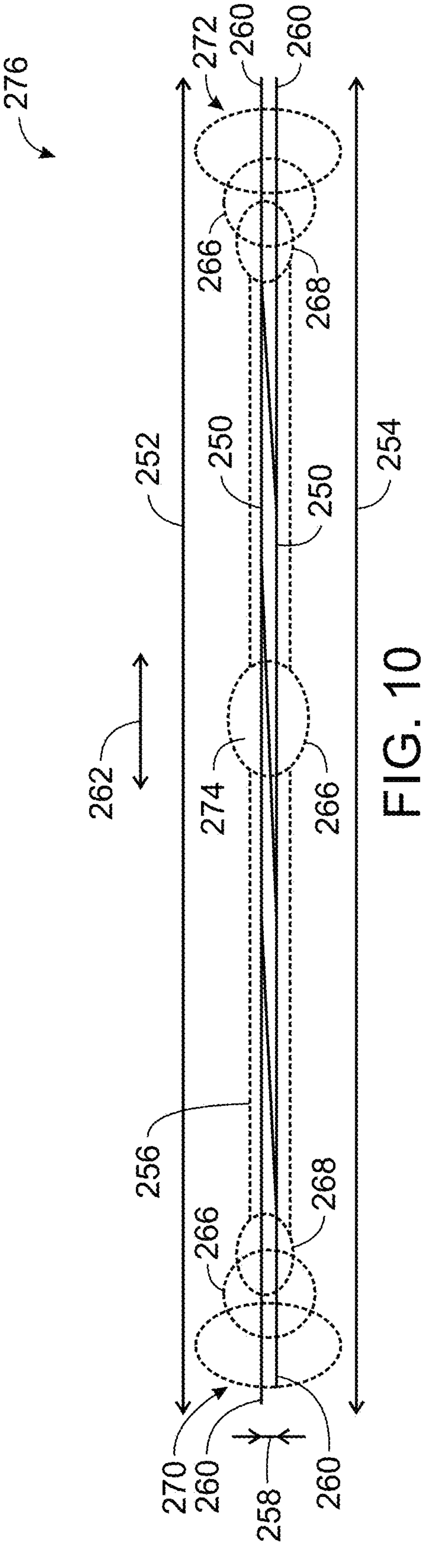
FIG. 10 is a schematic diagram of an overmolded conductive wire assembly, in accordance with aspects of the present disclosure (e.g., having additional features overmolded and a twist), in accordance with aspects of the present disclosure.

FIG. 10 is a schematic diagram of an overmolded conductive wire assembly 276 (e.g., having additional features overmolded and a twist). The overmolded conductive wire assembly 276 is manufactured utilizing either the method 212 in FIG. 5 or the method 226 in FIG. 6. The overmolded conductive wire assembly 276 is as described in FIG. 9. In addition, the pair of conductive wires are twisted in the axial direction 262. In certain embodiments, wherein the overmolded conductive wire assembly 276 has a former, the former is also twisted in circumferential direction along the axial direction 262. The twist may be a slow linear twist (e.g., of 90 or 180 degrees approximately every 5 cm) in the overmolded conductive wire assembly 276 for better flexing on both axes. The amount and rate of twisting may vary based on the desired characteristics for the coil element.

Figure 11:
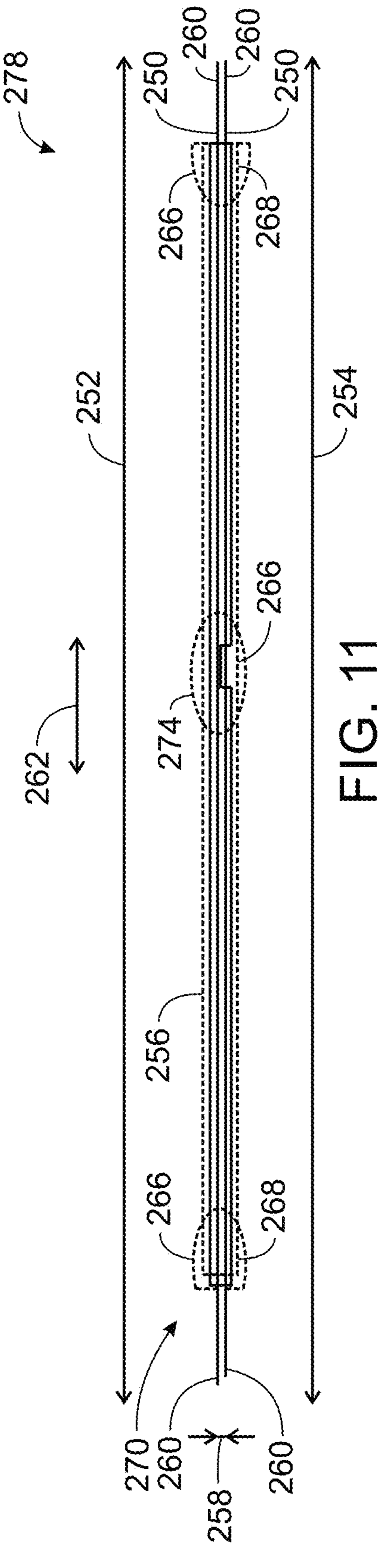
FIG. 11 is a schematic diagram of an overmolded conductive wire assembly, in accordance with aspects of the present disclosure (e.g., having additional features overmolded, a notch, and a twist), in accordance with aspects of the present disclosure.

FIG. 11 is a schematic diagram of an overmolded conductive wire assembly 278 (e.g., having additional features overmolded, a notch, and a twist). The overmolded conductive wire assembly 278 is manufactured utilizing either the method 212 in FIG. 5 or the method 226 in FIG. 6. The overmolded conductive wire assembly 276 is as described in FIG. 10. In addition, at least one of conductive wires includes cut or notch 280. The additional feature 274 is located about the cut or notch. The overmolding of the dielectric material 256 fills in the cut or notch 280.

Figure 12:
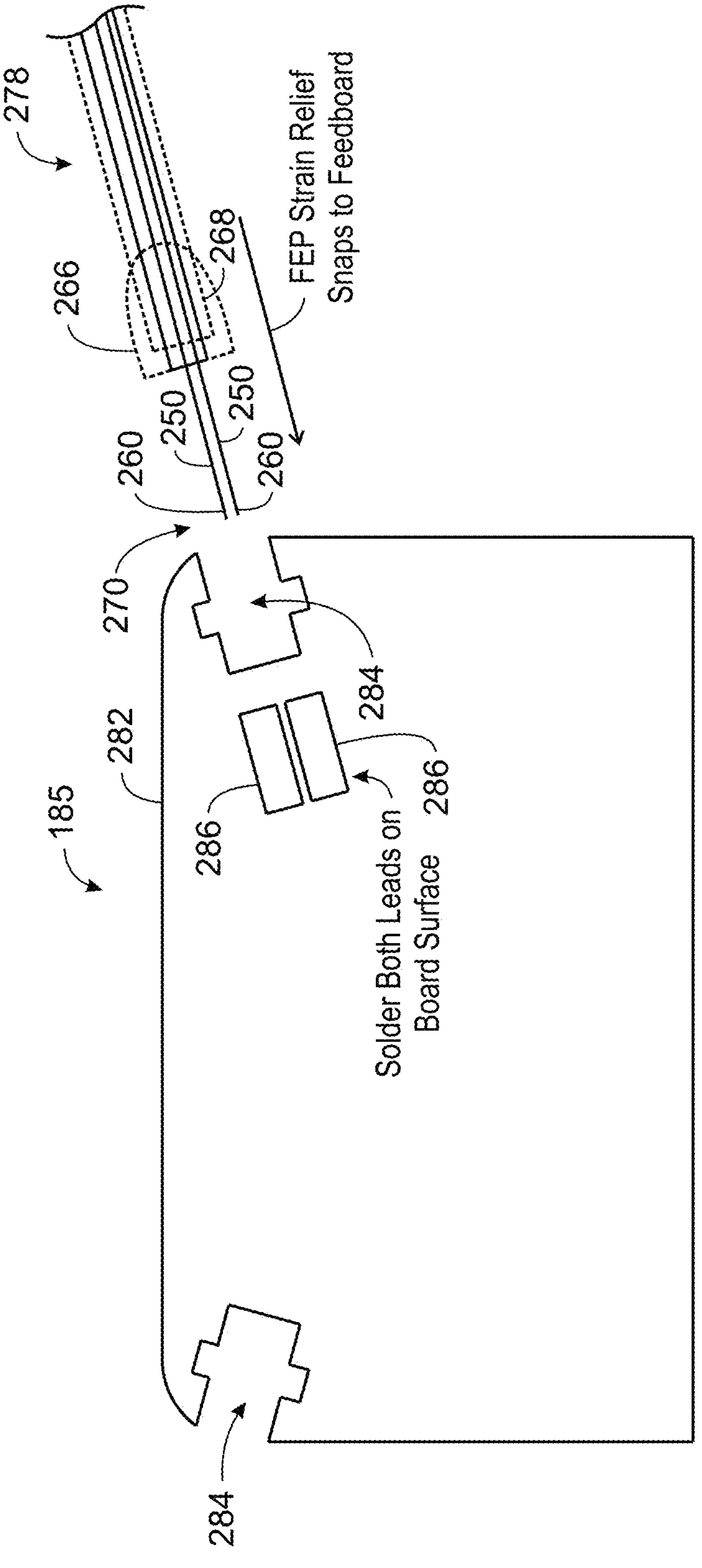
FIG. 12 is a schematic diagram of coupling of an end of an overmolded conductive wire assembly to an electronics unit, in accordance with aspects of the present disclosure.

FIG. 12 is a schematic diagram of coupling of an end 270 of an overmolded conductive wire assembly 278 (e.g., as described in FIG. 11) to the electronics unit 185. The electronics unit 185 includes a feedboard 282 (e.g., printed circuit board) As depicted, the electronics unit 185 includes receptacles 284 to receive ends 270 (and end 272 in FIG. 11) of the overmolded conductive wire assembly 278. The strain relief 268 is configured to snap into the receptacle 284 on the feedboard 282 to couple the end 270 of the overmolded conductive wire assembly 278 to the electronics unit 185. The respective ends 260 of the conductive wires 250 are then soldered to respective conductive pads 286 located on the feedboard 282 adjacent the receptacle 284. Coupling the overmolded conductive wire assembly 278 to the electronics unit 185 forms a coil element (e.g., loop).

Figure 13:
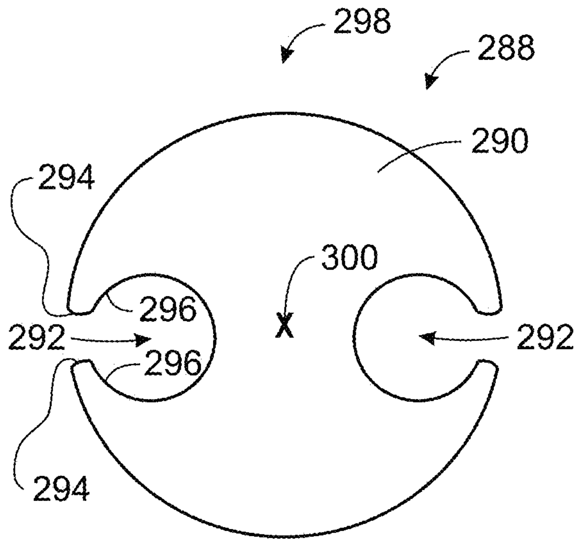
FIG. 13 is a schematic diagram of a longitudinal end of a former, in accordance with aspects of the present disclosure.

FIG. 13 is a schematic diagram of a longitudinal end 288 of a former 290. The former 290 includes receptacles 292 for receiving a pair of conductive wires. The former holds 290 the pair of conductive wires in a parallel arrangement at a fixed distance from each other when placed in the receptacles 292. The fixed distance may vary based on the desired characteristics for the coil element. The former 290 may be manufactured via microextrusion. The shape and dimension of the former 290 may vary. In certain embodiments, the former 290 may be made of material that is highly flexible, impervious to most corrosives, inert, heat resistant (e.g., up to 260 degrees Celsius), and having high dielectric strength. In certain embodiments, the former 290 is made of fluoroethylenepropylene (FEP) or polytetrafluoroethylene (PTFE). In an exemplary embodiment, the former 290 is made of PTFE. Respective edges 294 of the receptacles 292 include features 296 configured to grip a respective conductive wire of the pair of conductive wires. The features 296 extend in a circumferential direction 298 relative to a longitudinal axis 300 of the former 290 (as opposed to a radial direction).

Figure 14:
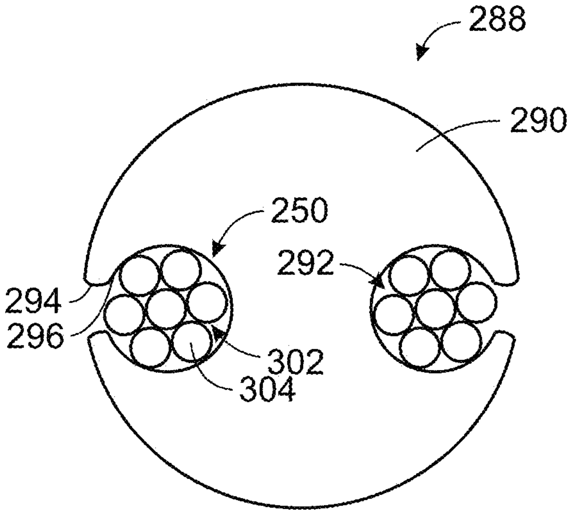
FIG. 14 is a schematic diagram of a longitudinal end of a former holding a pair of conductive wires, in accordance with aspects of the present disclosure.

FIG. 14 is a schematic diagram of the longitudinal end 288 of the former 290 in FIG. 13 holding a pair of conductive wires 250. As depicted, each conductive wire 250 includes a bundle 302 of conductive fibers 304.

Figure 15:
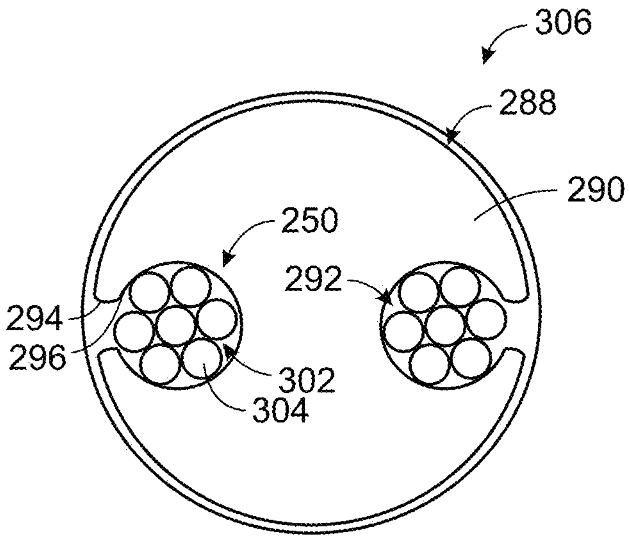
FIG. 15 is a schematic diagram of a longitudinal end of an overmolded conductive wire assembly, in accordance with aspects of the present disclosure.

FIG. 15 is a schematic diagram of the longitudinal end 288 of an overmolded conductive wire assembly 306. As depicted, a dielectric material 308 is overmolded over about the pair of conductive wires 250 and the former 290. As depicted, the dielectric material 308 extends into the receptacles 292 and is disposed about the conductive wires 250 in the receptacles 292. The dielectric material 308 may be may be rubber, plastic, or some other dielectric material (e.g., FEP or PTFE). In an exemplary embodiment, the dielectric material is 308 is FEP.

Figure 16:
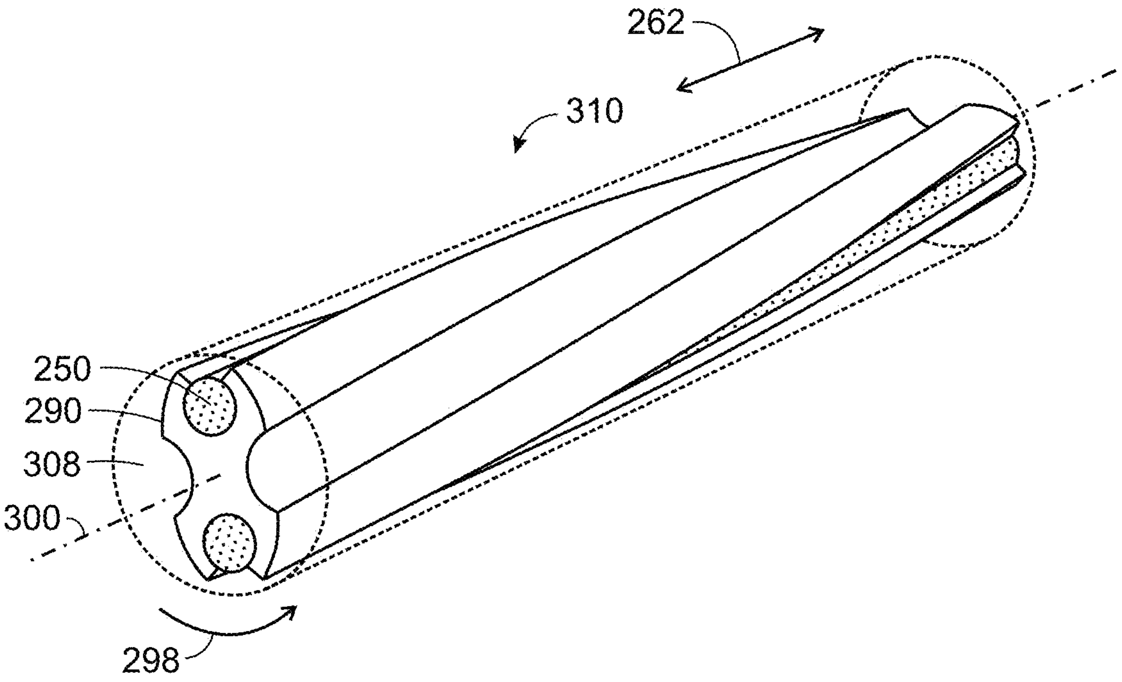
FIG. 16 is a perspective view of an overmolded conductive wire assembly, in accordance with aspects of the present disclosure.

FIG. 16 is a perspective view of an overmolded conductive wire assembly 310. The overmolded conductive wire assembly 310 includes a pair of conductive wires disposed with a former 290 and overmolded with the dielectric material 308 as described above. As depicted, the former 290 twists in the circumferential direction 298 relative to the longitudinal axis 300 of the former 290 along the axial direction 262. The twist may be a slow linear twist (e.g., of 90 degrees approximately every 5 cm) in the overmolded conductive wire assembly 310 for better flexing on both axes. The amount and rate of twisting may vary based on the desired characteristics for the coil element.

Figure 17:
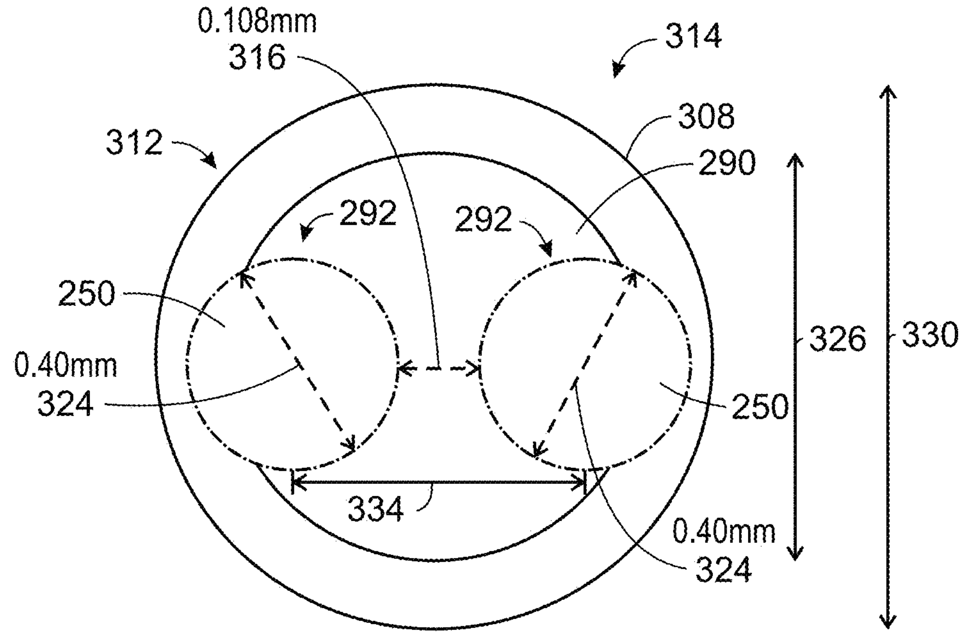
FIG. 17 is a schematic diagram of a longitudinal end of an overmolded conductive wire assembly having a first fixed distance between conductive wires, in accordance with aspects of the present disclosure.
Figure 18:
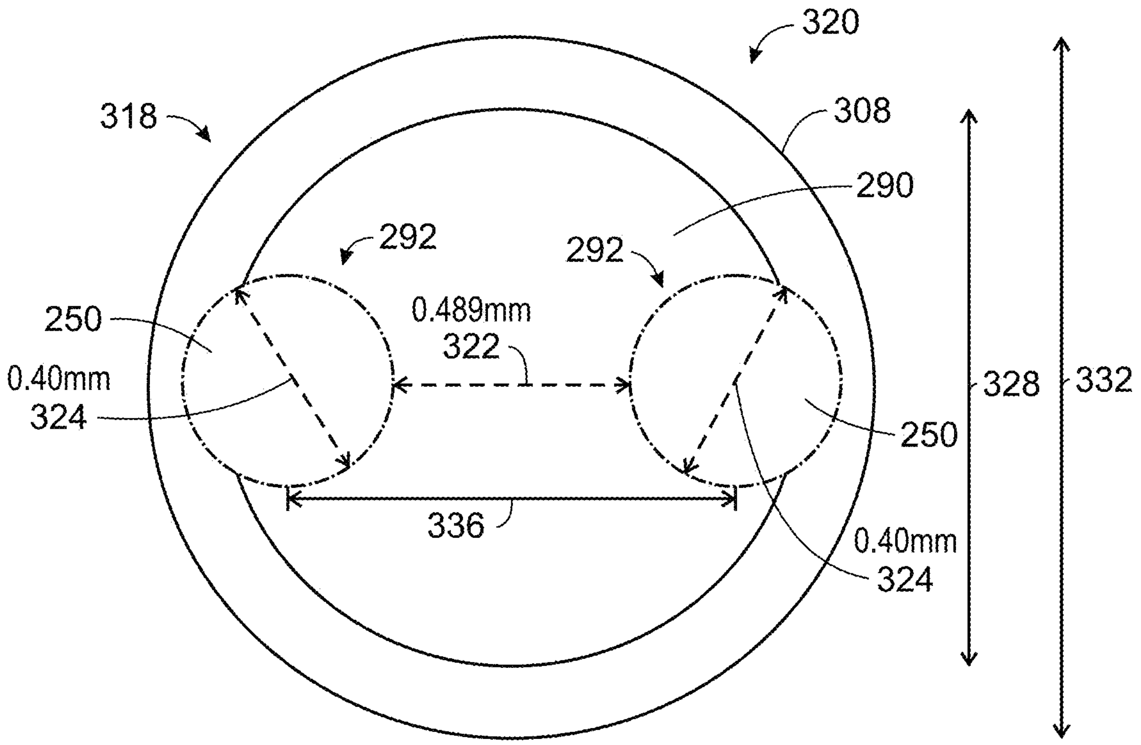
FIG. 18 is a schematic diagram of a longitudinal end of an overmolded conductive wire assembly having a second fixed distance between conductive wires, in accordance with aspects of the present disclosure.

FIG. 17 is a schematic diagram of a longitudinal end 312 of an overmolded conductive wire assembly 314 having a first fixed distance 316 between conductive wires 250. FIG. 18 is a schematic diagram of a longitudinal end 318 of an overmolded conductive wire assembly 320 having a second fixed distance 322 between conductive wires 250. The overmolded conductive wire assemblies 314 are as described above. In particular, for each overmolded conductive wire assembly 314, 320, a pair of conductive wires 250 are disposed with respective receptacles 292 of the former 290. Dielectric material 308 is overmolded over the pair of conductive wires 250 and the former 290. The conductive wires 250 have a diameter 324 (e.g., 0.40 millimeters (mm)). As depicted, the diameter 324 of each conductive wire 250 of the pair of conductive wires 250 is the same. As depicted, the diameter 324 of the conductive wires 250 in the different overmolded conductive wire assemblies 314, 320 is the same. In certain embodiments, the diameters 324 of the conductive wires 250 in the different overmolded conductive wire assemblies 314, 320 may vary based on the desired characteristics of the coil element. As depicted, the second fixed distance 322 (e.g., 0.489 mm) is greater than the first fixed distance 316 (e.g., 0.108 mm). The fixed distance may vary based on the desired characteristics of the coil element. The former 290 in the overmolded conductive wire assembly 314 has a diameter 326. The former 290 in the overmolded conductive wire assembly 320 has a diameter 328. The overmolded conductive wire assembly 314 has a diameter 330. The overmolded conductive wire assembly 320 has a diameter 332. The diameters 328, 332 are respectively greater than the diameters 326, 330 due to the second fixed distance 322 being greater than the first fixed distance 316. The overmolded conductive wire assembly 314 has a pitch 334 (e.g., distance between centers of the pair of conductive wires 250). The overmolded conductive wire assembly 320 has a pitch 336 (e.g., distance between centers of the pair of conductive wires 250). The pitch 336 (e.g., 0.889 mm) is greater than the pitch 334 (e.g., 0.508 mm). In certain embodiments, a fixed distance between the pair of conductive wires for overmolded conductive wire assemblies may vary between 0.108 mm and 0.489 mm. A pitch may be 0.40 mm greater than the fixed distance for an overmolded conductive wire assembly. Thus, in certain embodiments, a pitch for overmolded conductive wire assembly may vary between 0.508 mm and 0.889 mm.

Figure 19:
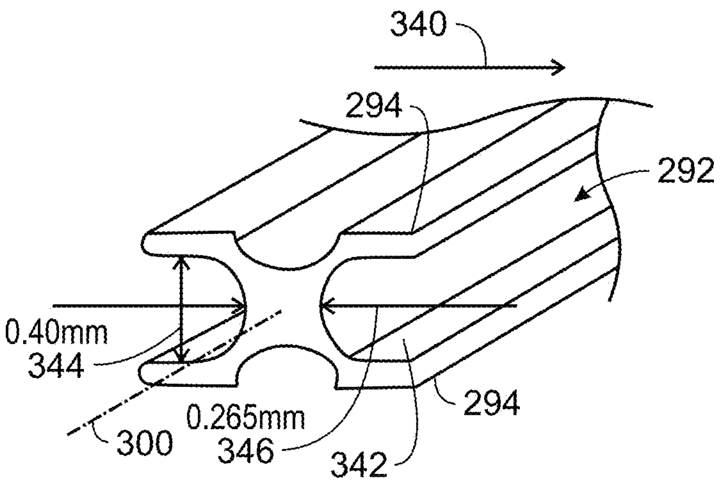
FIG. 19 is a perspective view of a portion of a former, in accordance with aspects of the present disclosure.

FIG. 19 is a perspective view of a portion of a former 338. The former 338 is similar to the former 290 described in FIG. 13. However, the respective edges 294 of the receptacles 292 of the former 338 extend in a radial direction 340 relative to the longitudinal axis 300 of the former 338. As depicted in FIG. 19, each receptacle 292 includes an inner surface 342. Each receptacle 292 includes a distance 344 (e.g., 0.40 mm) between the inner surface 342 of the edges 294. Each receptacle 292 also includes a distance or depth 346 (e.g., 0.265 mm) from the portion of the receptacle 292 closest to the longitudinal axis 300 to an outermost portion of the edges 294 in the radial direction 340.

Figure 20:
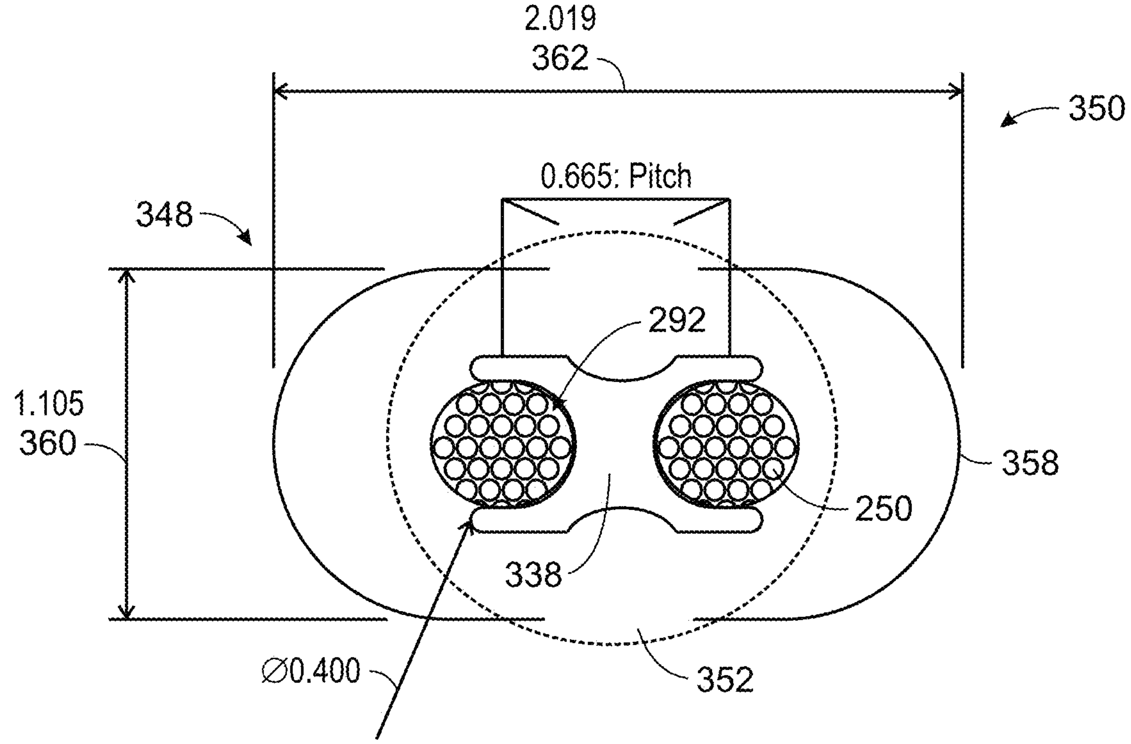
FIG. 20 is a schematic diagram of a longitudinal end of an overmolded conductive wire assembly having the former in FIG. 19, in accordance with aspects of the present disclosure.

FIG. 20 is a schematic diagram of a longitudinal end 348 of an overmolded conductive wire assembly 350 having the former 338 in FIG. 19. A pair of conductive wires 250 (e.g., each having a plurality of conductive fibers) are disposed within the receptacles 292 of the former 338. Dielectric material 352 is overmolded the conductive wires 250 and the former 338. The conductive wires 250 have a diameter 354 (e.g., 0.4 mm). A pitch 356 between centers of the conductive wires 250 is 0.665 mm. The overmolded conductive wire assembly 350 may include additional insulation 358 giving the overmolded conductive wire assembly 350 a height 360 of 1.105 mm and a width 362 of 2.019 mm.

Technical effects of the disclosed embodiments include enables creating an assembly (e.g., overmolded conductive wire assembly) at a required length and features with a dielectric material overmold. Technical effects of the disclosed embodiments also include providing a more static approach or process to set wires more precisely in the dielectric material (i.e., to control wire spacing). Technical effects of the disclosed embodiments further include enabling advanced features (e.g., strain reliefs) to be overmolded on that provide a robust and simple interface with a feedboard of an electronics unit. Technical effects of the disclosed embodiments even further include providing a slow linear twist (e.g., of 90 or 180 degrees approximately every 5 centimeters (cm)) in the assembly for better flexing on both axes. Technical effects of the disclosed embodiments still further include providing a more reliable approach for manufacturing resonators for an RF coil.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S. C. 112(f). However, for any claims containing elements designated in any other manner, it is intended that such elements are not to be interpreted under 35 U.S. C. 112(f).

The disclosure also provides support for a method for manufacturing overmolded resonators for a radio frequency receiving coil assembly for a magnetic resonance imaging system, comprising: providing a pair of conductive wires, wherein each conductive wire of the pair of conductive wires has a set required length; holding the pair of conductive wires in a fixed spatial arrangement relative to each other; overmolding dielectric material over the pair of conductive wires to form an overmolded conductive wire assembly; and coupling the pair of conductive wires to an electronics unit. In a first example of the method, the method further comprises placing each conductive wire of the pair of conductive wires into a respective receptacle of a former, wherein former holds the pair of conductive wires in a parallel arrangement at a fixed distance from each other. In a second example of the method, optionally including the first example, the method further comprises overmolding the dielectric material over the pair of conductive wires and the former. In a third example of the method, optionally including one or both of the first and second examples, the method further comprise wherein the former is made of a material that is chemically inert and flexible. In a fourth example of the method, optionally including one or more or each of the first through the third examples, the method further comprises, prior to overmolding with the dielectric material, twisting the former holding the pair of conductive wires. In a fifth example of the method, optionally including one or more or each of the first through the fourth examples, respective outer edges of each receptacle of the former comprise features to grip a respective conductive wire of the pair of conductive wires. In a sixth example of the method, optionally including one or more or each of the first through the fifth examples, the overmolded resonators have a distributed capacitance. In a seventh example of the method, optionally including one or more or each of the first through the sixth examples, the method further comprises, prior to overmolding with the dielectric material, cutting at least one conductive wire of the pair of conductive wires while being held. In an eight example of the method, optionally including one or more or each of the first through the seventh examples, overmolding comprises overmolding additional features on an overmolding disposed over the pair of conductive wires. In a ninth example of the method, optionally including one or more or each of the first through the eighth examples, the additional features comprise respective strain reliefs located at respective ends of the overmolded conductive wire assembly, wherein the respective strain reliefs are configured to snap into a feedboard of the electronics unit.

The disclosure also provides support for a method for manufacturing overmolded resonators for a radio frequency receiving coil assembly for a magnetic resonance imaging system, comprising: placing each conductive wire of a pair of conductive wires into a respective receptacle of a former, wherein each conductive wire of the pair of conductive wires has a set required length, and the former holds the pair of conductive wires in a parallel arrangement at a fixed distance from each other; overmolding an dielectric material over the pair of conductive wires and the former to form an overmolded conductive wire assembly; and coupling the pair of conductive wires to an electronics unit. In a first example of the method, the former is made of a material that is chemically inert and flexible. In a second example of the method, optionally including the first example, the method further comprises, prior to overmolding with the dielectric material, twisting the former holding the pair of conductive wires. In a third example of the method, optionally including one or both of the first and second examples, respective outer edges of each receptacle of the former comprise features to grip a respective conductive wire of the pair of conductive wires. In a fourth example of the method, optionally including one or more or each of the first through third examples, the overmolded resonators have a distributed capacitance. In a fifth example of the method, optionally including one or more or each of the first through fourth examples, the method further comprises, prior to overmolding with the dielectric material, cutting at least one conductive wire of the pair of conductive wires while being held by the former. In a sixth example of the method, optionally including one or more or each of the first through fifth examples, overmolding comprises overmolding additional features on an overmolding disposed over the pair of conductive wires. In a seventh example of the method, optionally including one or more or each of the first through sixth methods, the additional features comprise respective strain reliefs located at respective ends of the overmolded conductive wire assembly, wherein the respective strain reliefs are configured to snap into a feedboard of the electronics unit.

The disclosure also provides support for a radio frequency (RF) receiving coil assembly for a magnetic resonance imaging system, comprising: an RF coil comprising a plurality of loops, wherein each loop comprises an overmolded conductive wire assembly having a plurality of overmolded resonators, wherein each overmolded conductive wire assembly comprises a pair of conductive wires with each wire disposed in a respective receptacle of a former, each conductive wire of the pair of conductive wires has a set required length, the former holds the pair of conductive wires in a parallel arrangement at a fixed distance from each other, and dielectric material is overmolded over the pair of conductive wires and the former. In a first example of the RF receiving coil assembly, each overmolded conductive wire assembly comprises respective strain reliefs overmolded at respective ends of the overmolded conductive wire assembly, wherein the respective strain reliefs are configured to snap into a feedboard of an electronics unit.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for manufacturing overmolded resonators for a radio frequency receiving coil assembly for a magnetic resonance imaging system, comprising:

providing a pair of conductive wires, wherein each conductive wire of the pair of conductive wires has a set required length;

holding the pair of conductive wires in a fixed spatial arrangement relative to each other by placing each conductive wire of the pair of conductive wires into a respective receptacle of a former, wherein former holds the pair of conductive wires in a parallel arrangement at a fixed distance from each other;

overmolding dielectric material over the pair of conductive wires to form an overmolded conductive wire assembly; and coupling the pair of conductive wires to an electronics unit.

2. The method of claim 1, further comprising overmolding the dielectric material over the pair of conductive wires and the former.

3. The method of claim 1, wherein the former is made of a material that is chemically inert and flexible.

4. The method of claim 1, further comprising, prior to overmolding with the dielectric material, twisting the former holding the pair of conductive wires.

5. The method of claim 1, wherein respective outer edges of each receptacle of the former comprise features to grip a respective conductive wire of the pair of conductive wires.

6. The method of claim 1, wherein the overmolded resonators have a distributed capacitance.

7. The method of claim 1, further comprising, prior to overmolding with the dielectric material, notching at least one conductive wire of the pair of conductive wires while being held.

8. The method of claim 1, wherein overmolding comprises overmolding additional features on an overmolding disposed over the pair of conductive wires.

9. The method of claim 8, wherein the additional features comprise respective strain reliefs located at respective ends of the overmolded conductive wire assembly, wherein the respective strain reliefs are configured to snap into a feedboard of the electronics unit.

10. A method for manufacturing overmolded resonators for a radio frequency receiving coil assembly for a magnetic resonance imaging system, comprising:

placing each conductive wire of a pair of conductive wires into a respective receptacle of a former, wherein each conductive wire of the pair of conductive wires has a set required length, and the former holds the pair of conductive wires in a parallel arrangement at a fixed distance from each other;

overmolding a dielectric material over the pair of conductive wires and the former to form an overmolded conductive wire assembly; and coupling the pair of conductive wires to an electronics unit.

11. The method of claim 10, wherein the former is made of a material that is chemically inert and flexible.

12. The method of claim 10, further comprising, prior to overmolding with the dielectric material, twisting the former holding the pair of conductive wires.

13. The method of claim 10, wherein respective outer edges of each receptacle of the former comprise features to grip a respective conductive wire of the pair of conductive wires.

14. The method of claim 10, wherein the overmolded resonators have a distributed capacitance.

15. The method of claim 10, further comprising, prior to overmolding with the dielectric material, notching at least one conductive wire of the pair of conductive wires while being held by the former.

16. The method of claim 10, wherein overmolding comprises overmolding additional features on an overmolding disposed over the pair of conductive wires.

17. The method of claim 16, wherein the additional features comprise respective strain reliefs located at respective ends of the overmolded conductive wire assembly, wherein the respective strain reliefs are configured to snap into a feedboard of the electronics unit.

18. A radio frequency (RF) receiving coil assembly for a magnetic resonance imaging system, comprising:

an RF coil comprising a plurality of loops, wherein each loop comprises an overmolded conductive wire assembly having a plurality of overmolded resonators, wherein each overmolded conductive wire assembly comprises a pair of conductive wires with each wire disposed in a respective receptacle of a former, each conductive wire of the pair of conductive wires has a set required length, the former holds the pair of conductive wires in a parallel arrangement at a fixed distance from each other, and dielectric material is overmolded over the pair of conductive wires and the former.

19. The RF receiving coil assembly of claim 18, wherein each overmolded conductive wire assembly comprises respective strain reliefs overmolded at respective ends of the overmolded conductive wire assembly, wherein the respective strain reliefs are configured to snap into a feedboard of an electronics unit.

* * * * *